United States Patent
Agarwal

(10) Patent No.: US 6,580,115 B2
(45) Date of Patent: Jun. 17, 2003

(54) CAPACITOR ELECTRODE FOR INTEGRATING HIGH K MATERIALS

(75) Inventor: Vishnu K. Agarwal, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/880,536

(22) Filed: Jul. 19, 2001

(65) Prior Publication Data

US 2002/0030222 A1 Mar. 14, 2002

Related U.S. Application Data

(63) Continuation of application No. 09/225,887, filed on Jan. 5, 1999.

(51) Int. Cl.⁷ .................................. H01L 29/72
(52) U.S. Cl. .................. 257/310; 257/301; 257/72; 257/532; 257/751; 257/761
(58) Field of Search .................. 257/301, 310, 257/532, 751, 761, 72

(56) References Cited

U.S. PATENT DOCUMENTS

| | | | |
|---|---|---|---|
| 4,364,099 A | * 12/1982 | Koyama et al. | ............. 257/310 |
| 4,410,867 A | * 10/1983 | Arcidiacono et al. | ....... 257/310 |
| 5,099,305 A | 3/1992 | Takenaka | |
| 5,111,355 A | 5/1992 | Anand et al. | |
| 5,187,638 A | 2/1993 | Sandhu et al. | |
| 5,227,855 A | 7/1993 | Momose | |
| 5,293,510 A | 3/1994 | Takenaka | |
| 5,369,296 A | 11/1994 | Kato | |
| 5,424,238 A | 6/1995 | Sameshima | |
| 5,443,688 A | 8/1995 | Toure et al. | |
| 5,452,178 A | 9/1995 | Emesh et al. | |
| 5,561,307 A | 10/1996 | Mihara et al. | |
| 5,612,082 A | 3/1997 | Azuma et al. | |
| 5,654,207 A | 8/1997 | Fukuyama et al. | |
| 5,688,724 A | 11/1997 | Yoon et al. | |
| 5,780,115 A | * 7/1998 | Park et al. | .................. 257/310 |
| 6,010,927 A | 1/2000 | Jones, Jr. et al. | |

* cited by examiner

Primary Examiner—Edward Wojciechowicz
(74) Attorney, Agent, or Firm—Knobbe, Martens, Olson & Bear, LLP

(57) ABSTRACT

A conductive composition of tantalum nitride is disclosed for use as a conductive element in integrated circuits. The layer is shown employed in a memory cell, and in particular in a cell incorporating a high dielectric constant material such as $Ta_2O_5$. The tantalum nitride can serve as a barrier layer protecting an underlying contact plug, or can serve as the top or bottom electrode of the memory cell capacitor. The titanium nitride has a nitrogen content of between about 7% and 40%, thereby balancing susceptibility to oxidation with conductivity. In an illustrative embodiment, the titanium nitride layer is a bilayer formed of a thick portion having a low nitrogen concentration, and thin portion with a higher nitrogen concentration. The thick portion thus carries the bulk of the current with low resistivity, while the thinner portion is highly resistant to oxidation.

16 Claims, 6 Drawing Sheets

CAPACITOR ELECTRODE FOR INTEGRATING HIGH K MATERIALS

REFERENCE TO RELATED APPLICATION

This application is a continuation of U.S. application Ser. No. 09/225,887, filed Jan. 5, 1999.

FIELD OF THE INVENTION

The present invention relates generally to integrated semiconductor memory cell capacitors. In particular, the invention relates to electrode compositions for memory cell capacitors incorporating high dielectric constant materials, and method of providing the same.

BACKGROUND OF THE INVENTION

A memory cell in an integrated circuit, such as a dynamic random access memory (DRAM) array, typically comprises a charge storage capacitor (or cell capacitor) coupled to an access device such as a Metal-Oxide-Semiconductor Field Effect Transistor (MOSFET). The MOSFET functions to apply or remove charge on the capacitor, thus effecting a logical state defined by the stored charge. The amount of charge stored on the capacitor is proportional to the capacitance, $C = k k_0 A/d$, where k is the dielectric constant of the capacitor dielectric, $k_0$ is the vacuum permittivity, A is the electrode area and d is the spacing between the electrodes.

Integrated circuits in general, including DRAMs, are continually being scaled down in pursuit of faster processing speeds and lower power consumption. As the packing density of storage cells continues to increase, each capacitor must still maintain a certain minimum charge storage to ensure reliable operation of the memory cell. It is thus increasingly important that capacitors achieve a high stored charge per footprint or unit of chip area occupied.

Several techniques have recently been developed to increase the total charge capacity of the cell capacitor without significantly affecting the chip area occupied by the cell. These techniques include increasing the effective surface area of the electrodes by creating folding structures such as trench or stacked capacitors. Such structures better utilize the available chip area by creating three dimensional shapes to which the conductive electrodes and capacitor dielectric conform. The surface of the electrodes may be further increased by providing a roughened surface to the bottom electrode over which the capacitor dielectric and the top electrode are conformally deposited.

Other techniques concentrate on the use of new dielectric materials having higher dielectric constants (k). Such materials include tantalum oxide ($Ta_2O_5$), barium strontium titanate (BST), strontium titanate (ST), barium titanate (BT), lead zirconium titanate (PZT), and strontium bismuth tantalate (SBT). These materials are characterized by effective dielectric constants significantly higher than conventional dielectrics (e.g., silicon oxides and nitrides). Whereas k equals 3.9 for silicon dioxide, the dielectric constants of these new materials can range from 20 to 40 (tantalum oxide) to 300 (BST), and some even higher (600 to 800). Using such materials enables the creation of much smaller and simpler capacitor structures for a given stored charge requirement, enabling the packing density dictated by future circuit design.

Difficulties have been encountered, however, in incorporating these materials into fabrication process flows. For example, $Ta_2O_5$ is deposited by chemical vapor deposition (CVD) employing organometallic precursors in a highly oxidizing ambient. Additionally, after deposition the material must be annealed to remove carbon. This anneal is typically conducted in the presence of nitrous oxide ($N_2O$), which is also highly oxidizing, while volatile carbon complexes are driven out.

Due to the volatility of the reactants and by-products of processes for forming high k materials, surrounding materials are subject to degradation. For example, polycrystalline silicon (polysilicon) capacitor plates are subject to oxidation, as are polysilicon or tungsten plugs below stacked capacitors, and the silicon substrate itself. While electrodes can be made of noble metals, such as platinum, oxygen tends to diffuse through such metal electrodes, such that surrounding oxidizable materials are still subject to degradation.

Oxidation of either the electrode or the underlying polysilicon plug reduces conductivity of these electrical elements, and has been viewed as a major obstacle to incorporating high k materials into integrated circuits. At the same time, memory cell capacitors must be electrically connected to integrated devices (e.g., transistors). Past efforts have therefore focused on using highly conductive diffusion barriers between the high dielectric material and the oxidizable elements such as polysilicon plugs. Solutions to date have not been satisfactory, however, and integrated capacitors incorporating high k materials have not demonstrated the desired reliability for incorporation into commercial memory devices.

Thus, a need exists for a capacitor structure and a process flow for reliably integrating high dielectric constant materials into memory cell capacitors.

SUMMARY OF THE INVENTION

In accordance with one aspect of the invention, a composition is provided for use in the fabrication of integrated circuits. The composition comprises a tantalum nitride material with a nitrogen content between about 7% and 40%.

In the illustrated embodiments, the tantalum nitride serves as an electrode for a capacitor, adjacent a high dielectric constant material such as $Ta_2O_5$, or as a barrier layer between such a capacitor and the underlying substrate. Advantageously, the composition provides conductivity while reducing oxidation of the electrode and surrounding conductive elements. In one embodiment, a tantalum nitride layer serves as the top or reference electrode of a capacitor, directly contacting a high dielectric material.

The tantalum nitride composition can take the form of a singular layer or a multiple layer structure. For example, a bilayer can be formed of a relatively thick, low nitrogen content sublayer which serves as a high conductivity current path, while a thinner, higher nitrogen content sublayer provides resistance to oxidation and to oxygen diffusion. Accordingly, the sublayer with higher nitrogen content directly contacts the high dielectric constant material in one embodiment.

Other aspects and advantages of the invention will be apparent from the Detailed Description below, and from the appended claims.

BRIEF DESCRIPTION OF THE DRAWINGS

The present invention is described in more detail below in connection with the attached drawings, in which.

DETAILED DESCRIPTION OF THE PREFERRED EMBODIMENT

While illustrated in the context of a dynamic random access memory (DRAM) cell, the skilled artisan will find application for the materials and processes disclosed herein in a wide variety of contexts. The disclosed electrode materials, for example, have particular utility when employed adjacent an oxide dielectric film, the dielectric character of which is sensitive to the oxygen content in the film.

Figure 1:
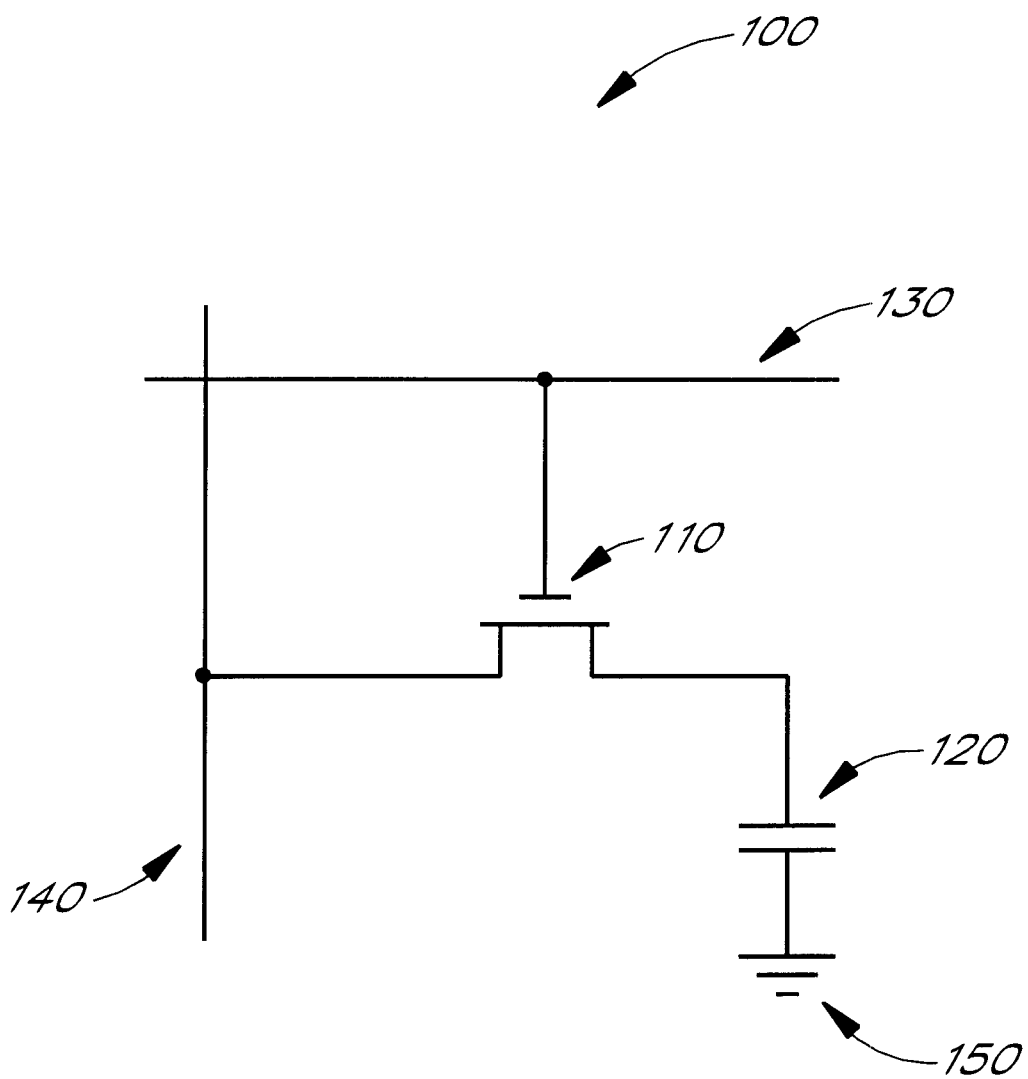
FIG. 1 is a circuit diagram of a memory cell in an integrated circuit.

FIG. 1 illustrates an exemplary circuit diagram of a single cell 100 in a DRAM array. The DRAM cell 100 comprises a transistor 110, a capacitor 120, and a plurality of lines 130 and 140. The transistor 110, which is connected to the capacitor 120 which is connected to a common voltage or an electrical ground 150, is connected to two lines, a word line 130 and a bit line 140. The general operation of a DRAM cell 100 is well known in the art and is not described here.

Figure 2:
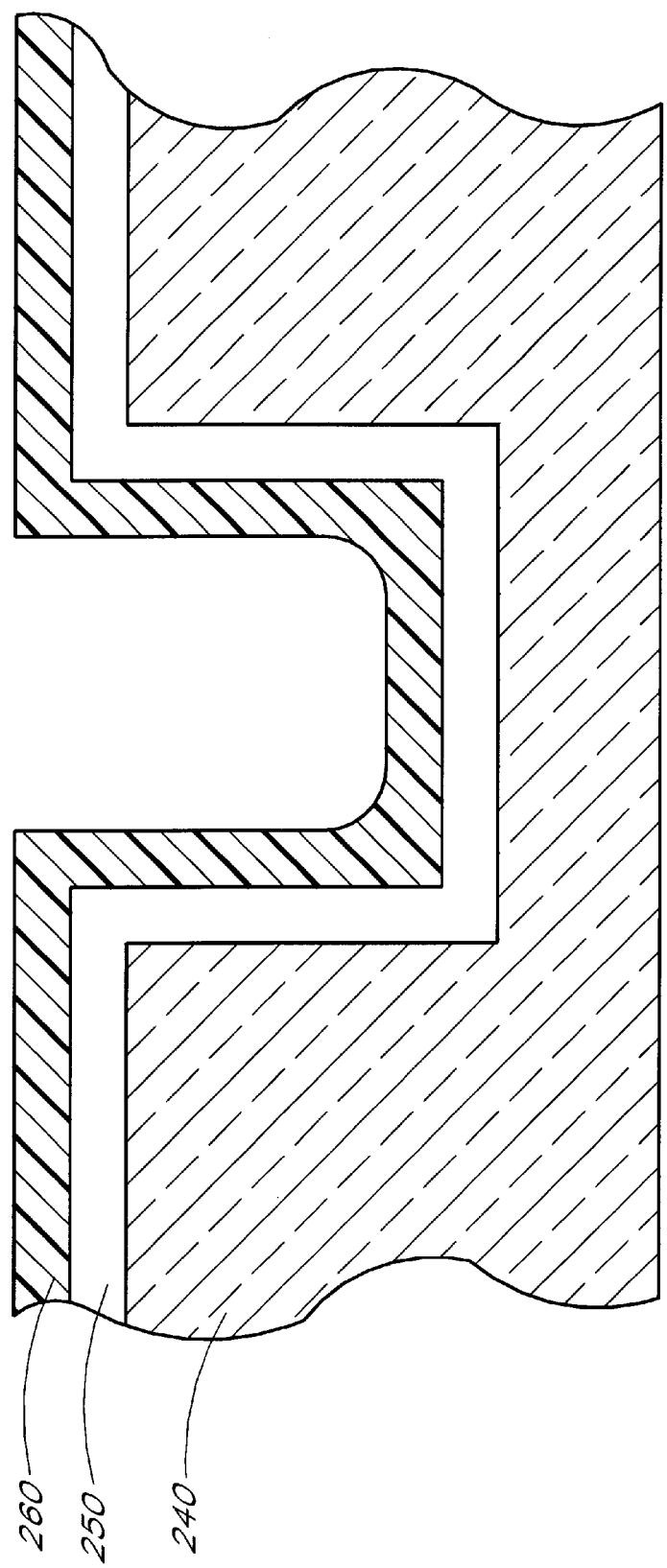
FIG. 2 is a schematic cross-section of a partially fabricated memory cell, in accordance with a preferred embodiment.

FIG. 2 schematically illustrates a partially fabricated memory cell 5 formed within and over a semiconductor substrate 10, in accordance with a preferred embodiment. While the illustrated substrate 10 comprises an intrinsically doped monocrystalline silicon wafer, it will be understood by one of skill in the art of semiconductor fabrication that the "substrate" in other arrangements can comprise other forms of semiconductor layers which include active or operable portions of semiconductor devices.

In the illustrated embodiment, a plurality of transistor gate electrodes 12 overlie the substrate 10, adjacent transistor active areas 14 within the substrate 10. It will be understood that several transistors are formed across a memory array within a DRAM circuit or chip. Field oxide elements 16 isolate the active areas 14 of different transistors. The width of the gates are preferably less than about 0.25 $\mu$m for current and future generation integrated circuits. For a given circuit design, the gate width is referred to as the "resolution" or "critical dimension" and it affects many features of the overall circuit design.

A first insulating layer 17 is shown covering the gate electrodes 12. Generally, this insulating layer 17 comprises a form of oxide, such as borophosphosilicate glass (BPSG). Depending upon the presence or absence of other circuit elements, the first insulating layer 17 has a thickness between about 0.5 $\mu$m to 1.0 $\mu$m. For example, certain DRAM circuit designs called for "buried" digit lines running below the cell capacitors, such that a thicker insulating layer is required to electrically isolated the digit line from the underlying transistors and the overlying capacitors.

A conductive contact 18 is shown extending through the first insulating layer 17 to electrically contact an active area 14 between gate electrodes. In the illustrated embodiment, the material comprises conductively doped polycrystalline silicon, which advantageously can be deposited into deep, narrow contact vias with good step coverage by chemical vapor deposition (CVD), and furthermore exhibit a very high melting point to withstand further front-end high temperature processing. In accordance with industry terminology, the conductive contact shall be referred to as a "poly plug" 18. Typically, the poly plug 18 has the same width as the gate electrodes 12.

A structural layer 22 is then formed over the first insulating layer 17. As will be better understood from the methods described below, this layer 22 need not become a permanent part of the circuit. Accordingly, the skilled artisan has a great deal of flexibility in the selection of this material. Preferably, the structural layer 22 is selectively etchable relative to the underlying first insulating layer 17 (BPSG in the preferred embodiment), and inexpensive to provide. For example, the structural layer can comprise an oxide derived from the decomposition of TEOS. Alternatively, the structural layer can also comprise BPSG, in which case an etch stop layer is preferably provided between the first insulating layer and the structural layer. The surface area and thus the capacitance of the memory cell 5 is influenced by the thickness of this structural layer 22. For the illustrated circuit, using 0.25 $\mu$m resolution, the structural layer 22 preferably has a thickness of greater than about 1.0 $\mu$m, more preferably between about 1.0 $\mu$m and 2.0 $\mu$m.

A via 24 is formed in the structural layer 22 to expose the underlying plug 18, and a conductive layer 26 deposited over the structural layer 22 and into the via 24 to make electrical contact with the plug 18. The top of the structural layer 22, and the portion of the conductive layer 26 overlying the structural layer 22, can then be planarized to leave the conductive layer 26 isolated within the via 24, as shown in FIG. 2. Such planarization can be accomplished by mechanical abrasion, preferably chemically aided by etchants in a slurry in a chemical mechanical planarization or polishing (CMP) process. Advantageously, CMP electrically isolates memory cells across an array from one another in a self-aligned manner, without the expense of an additional photolithographic mask step.

This isolated conductive layer 26 serves as the bottom or reference electrode of the memory cell 5, and in the illustrated embodiment comprises a conductively doped polysilicon, which is advantageously readily integrated with existing fabrication process flows. In other arrangements, however, non-oxidizing conductive materials such as rubidium oxide ($RuO_x$) or noble metals (e.g., platinum) can be employed for the bottom electrode.

The processes described to this point, creating the structure of FIG. 2, can be conventional. The illustrated polysilicon bottom electrode 26 thus takes on a three-dimensional folding shape which is of greater surface area than the area of the substrate 10 which the cell 5 occupies. Other methods of increasing surface area can include creating a rough surface on the bottom electrode, or creating multiple concentric container shapes for one memory cell. The skilled artisan will find application for the processes and materials discussed below for any of a number of capacitor configurations.

It will be understood that the layers of the remainder of the process are preferably applied to the structure of FIG. 2. Alternatively, the outside surface of the container-shaped polysilicon layer 26 can be exposed by etching back the remaining structural layer 22 prior to the processes disclosed below, thereby further increasing the effective bottom electrode surface area. For simplicity, however, the capacitor layers are illustrated in isolation in FIGS. 3 and 4.

Figure 3:
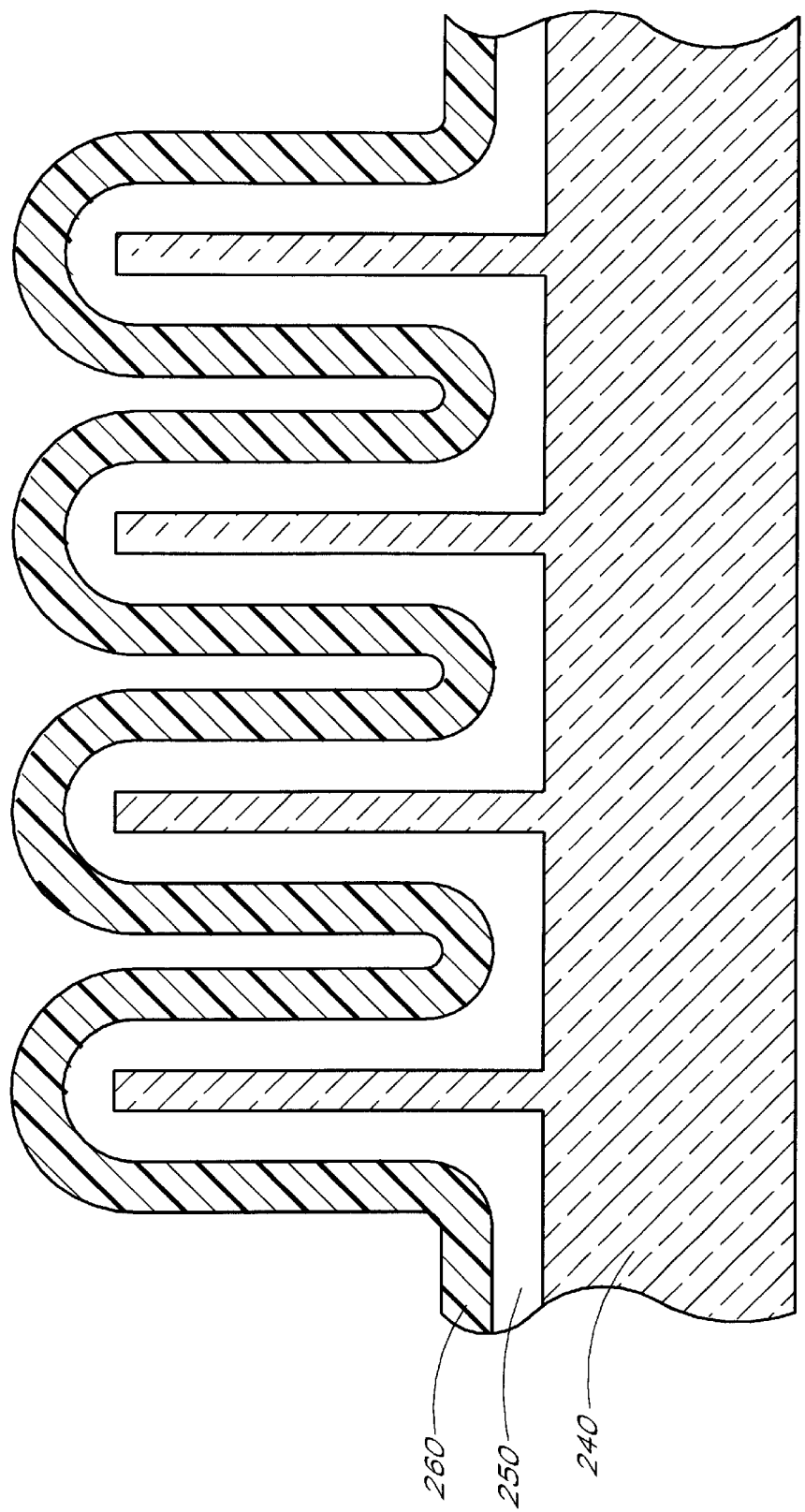
FIG. 3 is a schematic cross-section of a partially fabricated capacitor, showing a bottom electrode and dielectric layer.

FIG. 3 illustrates a capacitor dielectric 30 formed over the bottom electrode 26. In the illustrated embodiment, the dielectric 30 includes a thin barrier layer 32, as well as a layer of dielectric material characterized by a high dielectric constant, which shall be referred to herein as a high k material 34. The illustrated barrier layer 32 comprises silicon nitride, which can be formed by nitridizing the bottom electrode 26 or by chemical vapor deposition. As silicon nitride is commonly used in the fabrication of integrated circuits, the details of its formation are well known and need not be expounded upon here.

While the illustrated silicon nitride barrier layer 32 lowers the effective dielectric constant of the capacitor dielectric 30 relative to the overlying high k material 34 alone, the nitride 32 advantageously acts as a diffusion barrier to prevent oxidation of the underlying bottom electrode 26. Preferably, the barrier layer 32 is stoichiometric nitride ($Si_3N_4$) of a minimal thickness to serve as an oxide barrier layer, and is between about 20 Å and 30 Å in the illustrated embodiment. The skilled artisan will readily recognize other materials which can serve this purpose, and in other arrangements a conductive diffusion barrier can form part of the bottom electrode, rather than lowering the dielectric constant of the capacitor dielectric.

Materials having high dielectric constants are to be distinguished from conventional dielectric materials such as silicon dioxide (k≈3.9), and the term "high k materials" refers herein to materials having dielectric constants greater than about 20. The high k dielectric layer 34 L preferably comprises a metal oxide, and can comprise a complex oxide such as SBT, BST, BT, ST, or PZT. These materials are discussed briefly in the Background of the Invention. In the illustrated embodiment, the high k material 34 comprises tantalum oxide ($Ta_2O_5$). While the dielectric constant (k) of $Ta_2O_5$ can vary from about 20 to 40, depending upon the phase and thickness of the material, the preferred layer 34 has a dielectric constant of about 28.

As is known in the art, tantalum oxide can be formed by chemical vapor deposition, using an organometallic precursor, followed by a high temperature anneal to drive out carbon complexes and cure the layer. Typically, the anneal comprises heating the substrate 10 to about 800° C. in a nitrous oxide ($N_2O$) environment. Ordinarily, such a process is highly oxidizing. In the illustrated embodiment, the bottom electrode 26 is protected from oxidation by the silicon nitride layer 32. Preferably, $Ta_2O_5$ is formed to a thickness of between about 40 Å and 100 Å and is about 75 Å in the illustrated embodiment.

Figure 4:
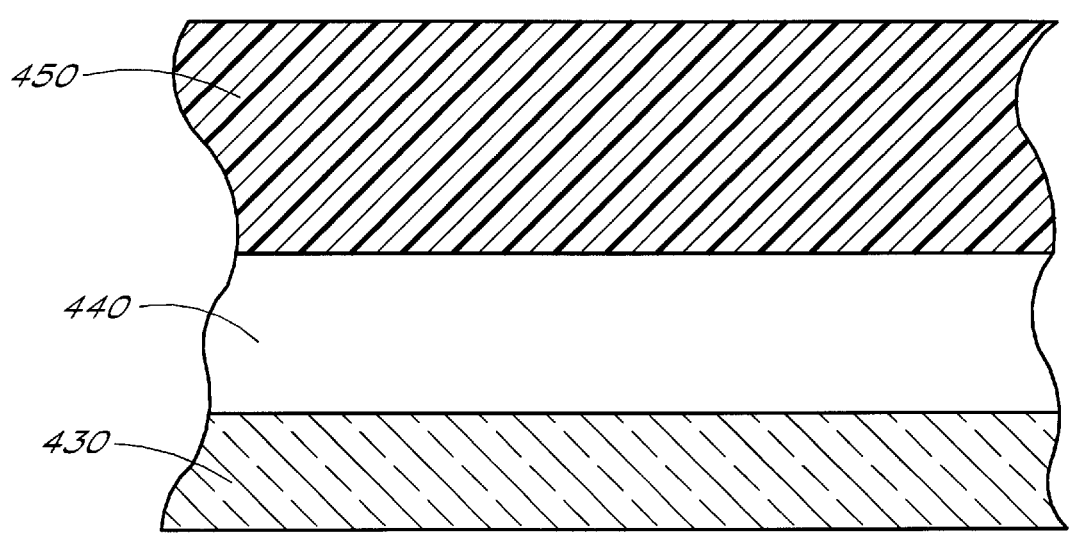
FIG. 4 shows the capacitor of FIG. 3 after formation of a top electrode.

As shown in FIG. 4, following deposition and curing anneal of the high k material 34, a second conductive layer 36 is formed above the capacitor dielectric 30. This second conductive layer 36 represents at least a portion of the top or reference electrode of the cell capacitor. As set forth in more detail below, the second conductive layer 36 comprises a metal including a resistivity-increasing impurity.

Previously employed electrode materials have focused on the barrier qualities of the conductive material and the susceptibility to oxidation. Susceptibility to oxidation, however, is typically measured by the conductivity of the electrode material. A material which oxidizes slightly but nevertheless remains highly conductive would ordinarily be considered a suitable electrode material. This focus on the conductivity of capacitor electrodes has similarly led to consideration of metal alloys for barrier properties combined with high conductivity.

Contrary to conventional electrodes, however, the preferred electrode layer 36 incorporates an impurity which can considerably lower conductivity relative to the metal. In the illustrated embodiment, the top electrode layer 36 comprises tantalum, and the impurity is nitrogen. Advantageously, the nitrogen content within the layer 36 occupies vacancies which might otherwise render the tantalum in the layer 36 susceptible to oxidation. The inventor has recognized that, while a reduction of conductivity due to incorporation of nitrogen is in general undesirable, the advantages of reducing oxidation of the top electrode layer 36 can outweigh the disadvantage of increased resistivity.

In particular, preventing oxidation of the top electrode advantageously prevents depletion of oxygen from the underlying high k dielectric layer 34. Even a very small loss of oxygen in such materials, while not significantly affecting electrode conductivity, can greatly affect the quality of the capacitor dielectric 30. Small amounts of oxygen depletion from the high k material 34 can leave conductive charge leakage paths through the capacitor dielectric 30. The inventor has found that tantalum electrodes having too low a nitrogen concentration (e.g., 1–2%), while highly conductive, lead to high leakage currents through the high k dielectric 34. On the other hand, nitrogen content of greater than about 40% renders the layer essentially resistive and effectively ceases to operate as an electrode.

Accordingly, the conductive layer 36 preferably comprises tantalum nitride having a nitrogen content between about 7% and 40% (i.e., a nitrogen atomic fraction of about 0.07 to 0.40). The fraction implies that there are between about 7 to 40 atoms of nitrogen per 100 atoms of $TaN_x$. More preferably, the nitrogen content of the conductive layer 36 is between about 12% and 30%, and most preferably between about 12% and 20%. An exemplary memory cell, including 75 Å of $Ta_2O_5$ under a $TaN_x$ top electrode incorporating about 30% nitrogen, exhibited capacitance of about 9 $fF/\mu m^2$ and a critical voltage $V_{crit}$ of about 1.6 volts, where $V_{crit}$ is the voltage for a leakage current density of $3 \times 10^{-7x}$ $A/cm^2$.

In forming the layer 36, any suitable process can be employed wherein the nitrogen content is controlled to fall within the desired ranges. For example, in a plasma enhanced or thermal CVD process, the relative flow rates of tantalum and nitrogen source gases can be controlled to achieve the appropriate composition, as will be appreciated by the skilled artisan.

In the illustrated embodiment, however, a metal target was sputtered in a nitrogen ambient. Tantalum targets, which are preferably at least 98% pure Ta, and more preferably about 99% pure Ta, can be obtained from Johnson Matthey of Spokane, Washington, or Tosoh SMD, Inc. of Colorado Springs, Colo. Desirably, the sputtering plasma comprises nitrogen ions from a nitrogen source gas, preferably $N_2$ or $NH_3$. In other arrangements, hydrogen or argon can also be added to the chamber to help maintain the plasma. Suitable sputtering reactors are commercially available from Applied Materials of Santa Clara, Calif., or Tokyo Electron Ltd of Japan.

In the illustrated embodiment, nitrogen ($N_2$) is introduced into the sputtering chamber at a rate of between about 2 sccm and 50 sccm, more preferably between about 2 sccm and 20 sccm. RF energy is generally set between about 500 W and 20,000 W, preferably between about 500 W and 5,000 W, and more preferably between about 500 W and 2,000 W for the wafer-target spacing (1–15 cm) of the preferred reactor. The nitrogen is incorporated into the deposited film. Desirably, chamber pressure is maintained between about 1 mTorr and 40 mTorr during the process. In light of the present disclosure, however, the skilled artisan can readily determine the appropriate sputtering parameters, through routine optimization, to achieve the desired $TaN_x$ composition in a given reactor configuration.

As deposited, the $TaN_x$ layer is amorphous with nitrogen dispersed throughout the layer. Preferably, therefore, the wafer is annealed after deposition to convert to the deposited layer 36 a more conductive crystalline phase. For example, the wafer can be heated to greater than about 750° C. for about 1–5 minutes. As a result of the anneal, crystal grains grow and orient within the layer 36 to TaN and Ta phases, and/or TaN and Ta phases, each of which is a more conductive structure. In the illustrated DRAM process flow, the anneal can be conducted simultaneously with a high temperature glass reflow step, as will be understood from the discussion of FIG. 5 below.

As also shown in FIG. 4, a third conductive layer 38 is preferably formed above the second conductive layer 36 and forms a part of the top electrode. Due to resistivity in the preferred $TaN_x$ top electrode layer 36 from incorporation of nitrogen, this conductive strapping layer 38 serves to reduce resistivity of signal propagation laterally across the common electrode. Exemplary materials for the strap 38 include polysilicon, tungsten and other materials which can withstand high temperature processing, as will be apparent to the skilled artisan.

After formation of the strap 38, the top electrode 36 and strap 38 are preferably patterned. While the $TaN_x$ layer 36 can form a common reference electrode for an array of memory cells (e.g., 256 KB per array), a typical memory chip contains multiple arrays (e.g., 64 arrays in a 16 MB DRAM). Accordingly, the top electrode 36, 38 is preferably patterned to isolate these arrays across the wafer. Moreover, it may be necessary to extend contacts through the electrode 36, 38 to establish circuit connections between overlying metallization levels and underlying electrical devices. Patterning of the preferred $TaN_x$ and polysilicon layers can be conducted, for example, by a reactive ion etch (RIE) through a photolithographic mask using fluorocarbon chemistry such as $CF_4$, $CHF_3$ and argon. Other possible etch chemistries include $Cl_2$, $Br_2$, etc.

Figure 5:
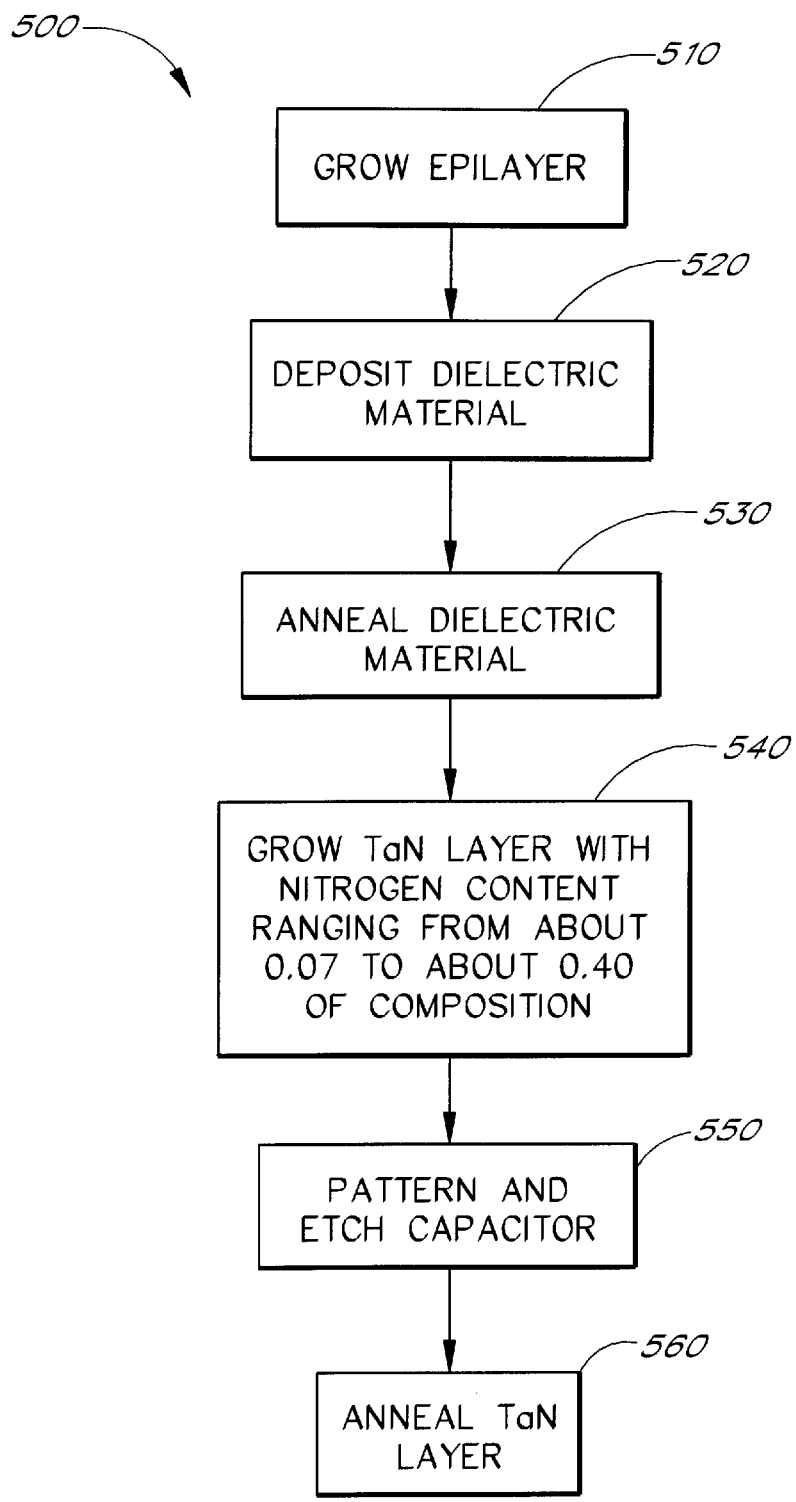
FIG. 5 shows the memory cell of FIG. 2, incorporating the capacitor structure of FIG. 4 and an overlying interlevel dielectric.

With reference now to FIG. 5, the memory cell 5 is shown with a completed capacitor structure. An interlevel dielectric (ILD) 40 has also been formed over the $TaN_x$ 36 and strap 38 layers. Typically, the ILD 40 comprises a form of oxide, such as borophosphosilicate glass (BPSG). Deposition of the BPSG is followed by a reflow anneal step for better step coverage and avoiding keyholes, as well as to densify the layer. The reflow is conducted by heating the wafer to temperatures of approximately 900° C. to 960° C. If not separately annealed before this point, the deposited amorphous $TaN_x$ layer can be converted to a crystalline phase during this high temperature reflow and form the conductive $TaN_x$ layer 36. Though not shown, the skilled artisan will appreciate that contacts are created through the BPSG 40 to connect the top electrode 36, 38 to wiring formed above or within the BPSG 40.

As shown, the capacitor dielectric 30 (comprising the barrier layer 32 and the high k layer 34) and top electrode 36, 38 can extend across the entire array, where the top electrode 36, 38 serves as a common reference electrode for the array. In other arrangements, the capacitor dielectric 30 and top electrode 36, 38 of FIG. 5 are next patterned to isolate individual cells across the array.

Figure 6:
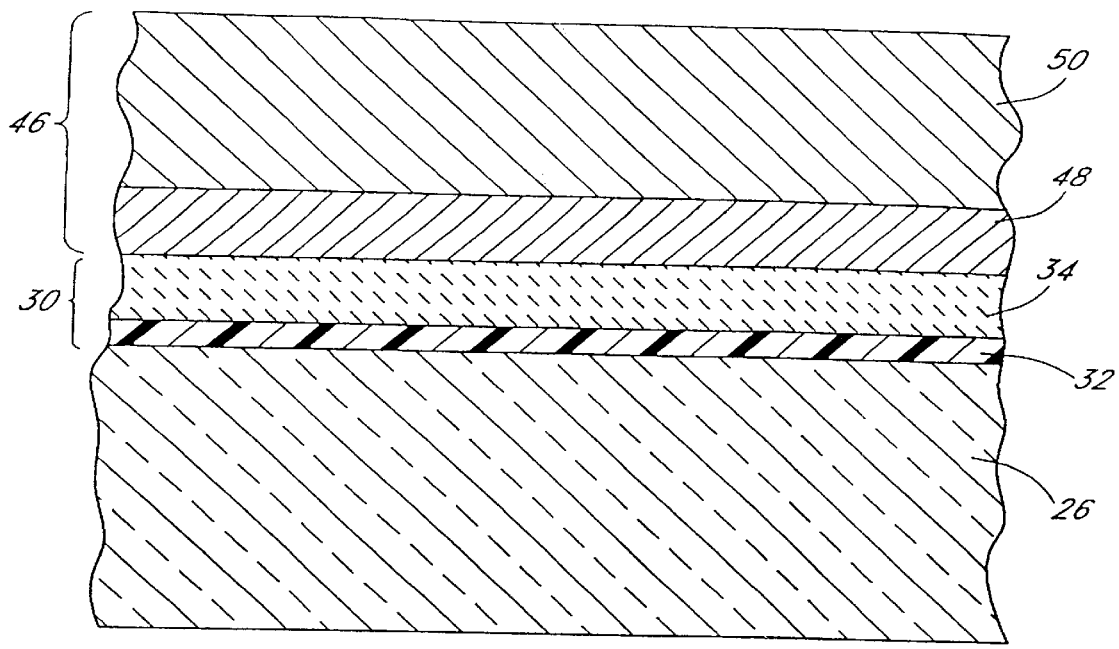
FIG. 6 is a schematic cross-section of a capacitor electrode, in accordance with a second embodiment of the invention.

FIG. 6 illustrates a second embodiment of the invention, wherein like numerals are used to refer to like parts, relative to the previously described embodiment. A capacitor electrode comprises a tantalum nitride bilayer 46. The bilayer 46 comprises a first $TaN_y$ layer 48 formed on top of the dielectric layer 34, and a second $TaN_z$ layer 50 formed on top of the first $TaN_y$ layer 48. One of the layers is thicker and has a lower nitrogen content layer than the other layer. Thus, the thicker, lower nitrogen content layer is relatively more conductive than the other layer, while the thinner, high nitrogen content layer is relatively more resistant to oxidation and oxygen diffusion therethrough.

In the illustrated application, where the bilayer 46 serves as a top electrode over a high k material such as $Ta_2O_5$, the first $TaN_y$ layer 48 has a thickness of about 10 Å to 200 Å, more preferably 40 Å to 100 Å, while the second $TaN_z$ layer 50 has a thickness between about 120 Å and 1,000 Å, more preferably about 150 Å to 450 Å. The thinner $TaN_y$ layer 48 preferably has a nitrogen atomic fraction between about 0.07 and 0.50 and more preferably about 0.15 to 0.40. The thicker $TaN_z$ layer 50 preferably has a nitrogen atomic fraction between about 0.0 and 0.30, and more preferably about 0.03 to 0.10.

Preferably, the overall nitrogen content remains within the range of about 7% to 40%, more preferably in the lower end of that range.

Such a construction advantageously provides a thin $TaN_y$ layer 48, immediately adjacent the high k material 34, which is relatively resistant to oxidation due to a high concentration of nitrogen. The $TaN_z$ layer 50 is thicker and has a smaller N concentration, thus providing conductivity for fast signal propagation and low power consumption.

The illustrated tantalum nitride bilayer 46 may be formed by any suitable technique. For example, during sputtering, the flow rates of $N_2$ can be decreased during the deposition of $TaN_y$ 48, relative to that during the deposition of $TaN_z$ 50. Alternatively, different deposition conditions can be used during different phases of an MOCVD process.

In the preferred embodiments described above, either the $TaN_x$ layer 38 or the $TaN_y$/$TaN_z$ bilayer 46 is utilized in the top or reference electrode, while the bottom electrode comprises polysilicon (or an oxidant-resistant material such as $RuO_x$ or Pt). This arrangement is preferred due to the highly oxidizing environment while the high k dielectric is being cured. Even titanium nitride layers, particularly those with low concentrations of nitrogen, can be subject to oxidation during such high temperature processing in the presence of $N_2O$. Since a barrier layer (e.g., the $Si_3N_4$ layer 32 beneath the dielectric 34) should be employed at any rate, the more conductive polysilicon can be used for the bottom electrode. It will be readily apparent to the skilled artisan, however, that the described $TaN_x$ and $TaN_y$/$TaN_z$ layer can be used as the bottom or storage electrode as well, particularly where the high k material is provided under lower temperature or less oxidizing processes.

Moreover, while not illustrated, it will be understood that a titanium nitride bilayer is particularly well suited to use as a bottom electrode. For such an embodiment, however, the sequence of deposition is preferably opposite that described for the top electrode (FIG. 6). In other words, the first formed layer preferably comprises a thick layer of $TaN_z$, with 0% to 30% nitrogen content, more preferably 3% to 10% nitrogen content, similar to the thicker layer 50 of FIG. 6. The second formed layer of the bilayer preferably comprises a relatively more thin layer of TaN$_y$ with 7% to 50% nitrogen content, more preferably 15% to 40% nitrogen content, similar to the thinner layer 48 of FIG. 6. The thicknesses and proportions can also similar to the thicker sublayer 50 and thinner sublayer 48 described above.

Thus, for a bottom electrode application, the more conductive portion of the tantalum nitride bilayer bottom electrode is formed first, between the circuit node and the dielectric, and the second, more oxidation-resistant layer is formed between the first portion of the bilayer and the dielectric. In accordance with this embodiment, a high k dielectric layer, even a complex oxide such as BST, can be formed directly on the thin, relatively high N-content second layer. The thinner, high N-content portion of the bilayer can server as a barrier layer, obviating a separate $Si_3N_4$ layer.

In forming a bilayer with the opposite sequence as that illustrated in FIG. 6, the nitrogen source gas flow can be increased toward the end of the deposition process, such that the top of the bilayer would have a higher nitrogen content. In other arrangements, a whole tantalum nitride layer can be deposited with a nitrogen content suitable for the first layer. The N concentration of the top portion of this layer can then be increased by annealing in $NH_3$, $N_2+H_2$ plasma, or other nitrogenous atmosphere, or by nitrogen implanting.

Figure 7:
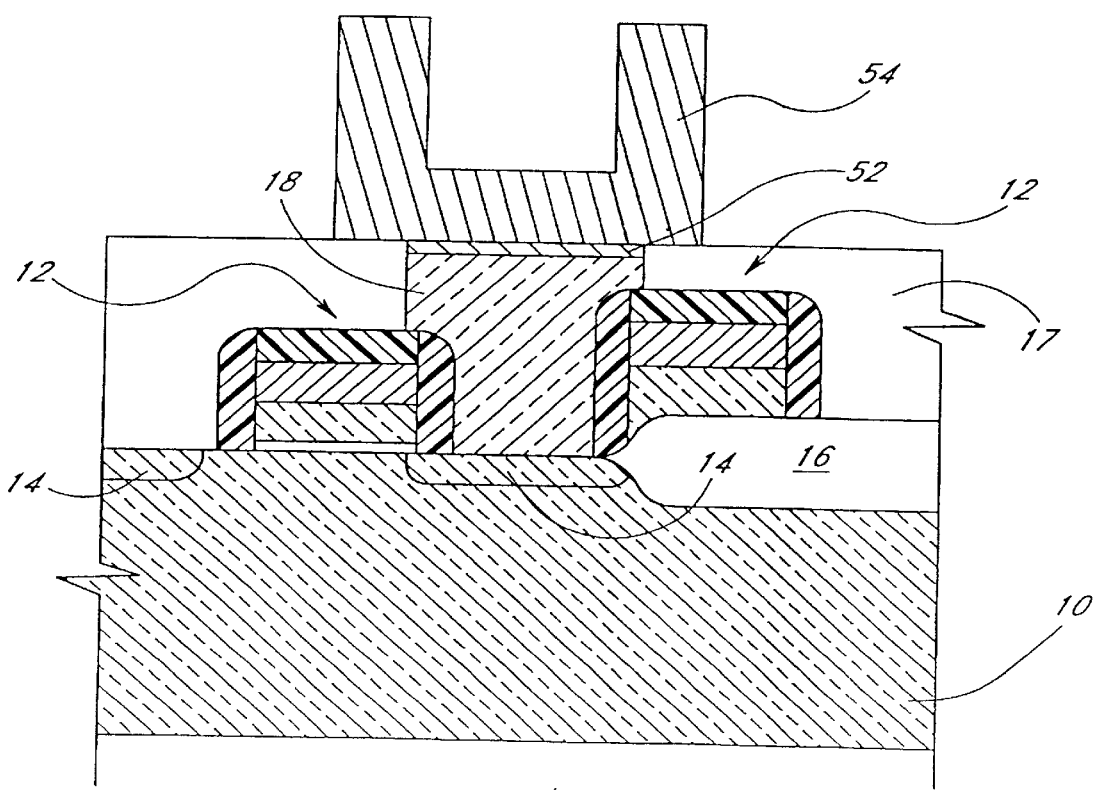
FIG. 7 is a schematic cross-section of a partially fabricated memory cell in accordance with a third embodiment of the invention.
Figure 2:
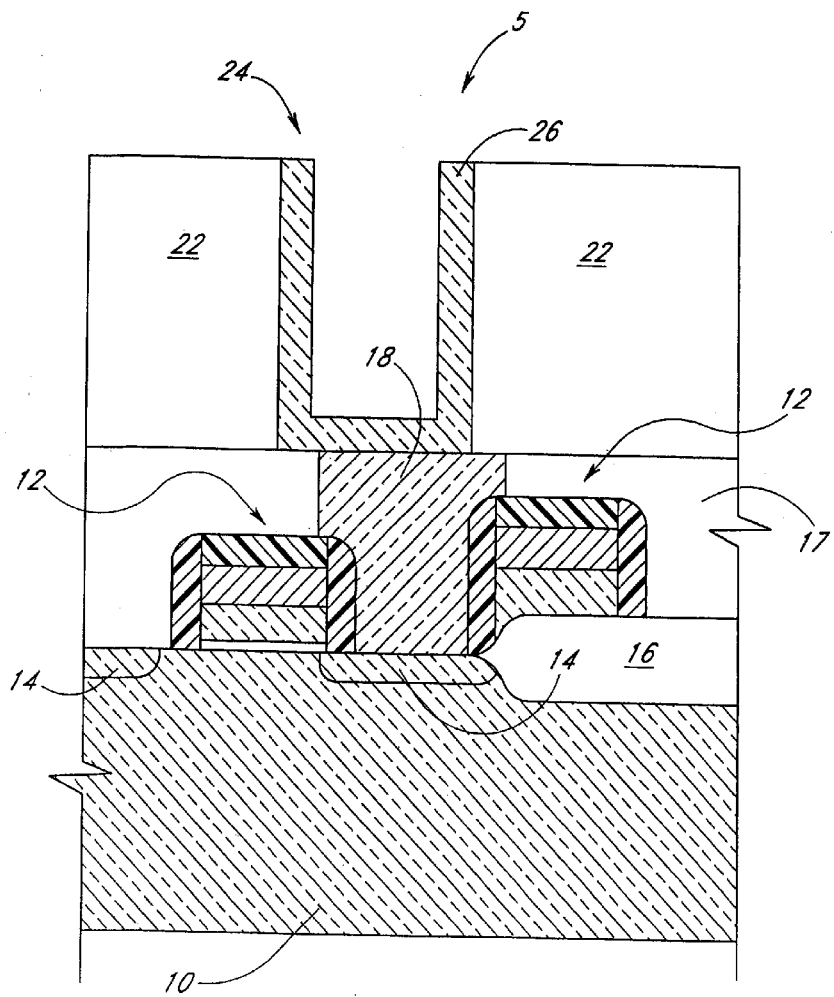
Figure 3:
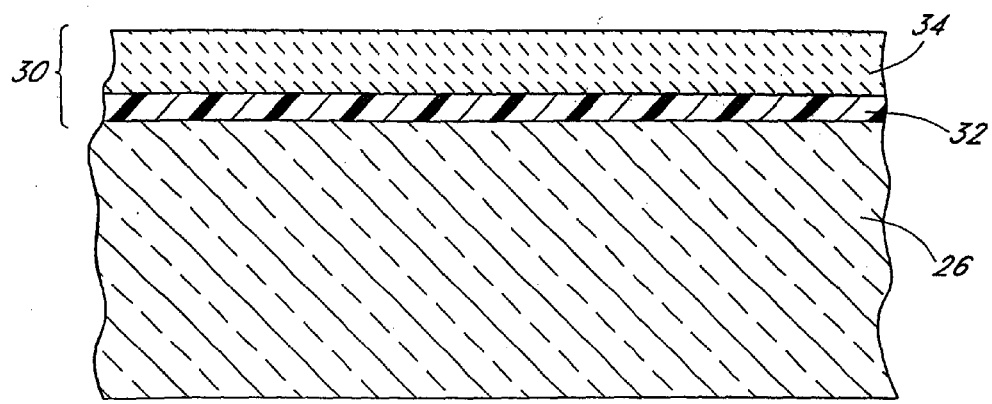
Figure 4:
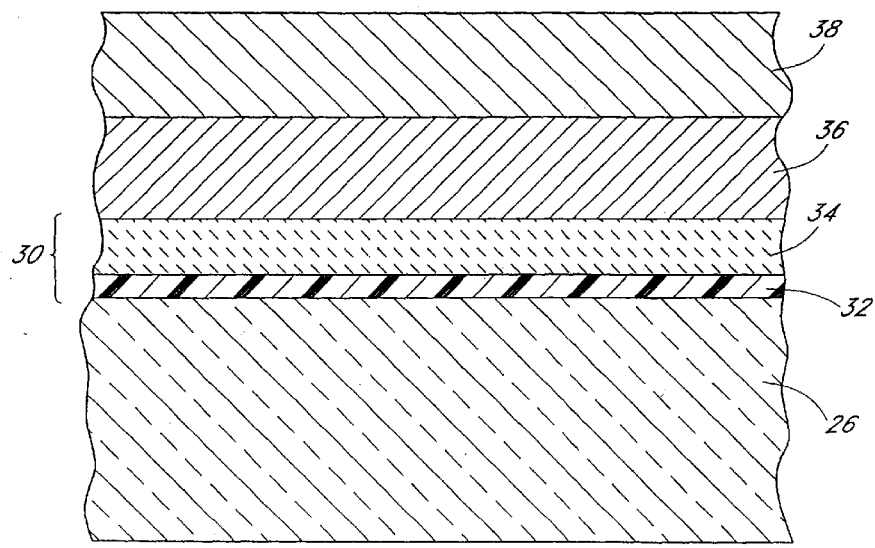
Figure 5:
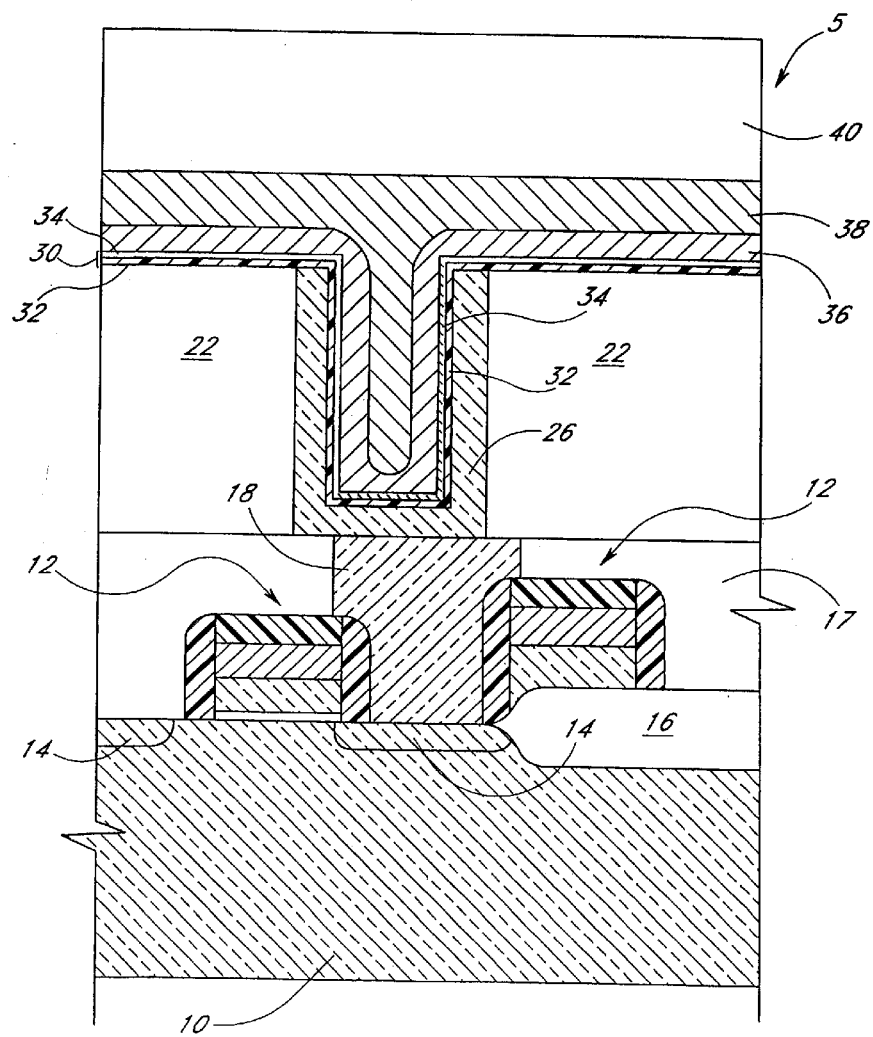

FIG. 7 illustrates a third embodiment of the invention, wherein like reference numerals are used to refer to parts similar to those of the previous embodiments. Thus, a polysilicon plug 18 is shown contacting an active area 14 of a semiconductor substrate 10, between two gate stacks 12. A bottom electrode 54 is formed above the poly plug 18, in electrical contact therewith.

In accordance with the third embodiment, a tantalum nitride layer 52 serves as a diffusion barrier between the bottom electrode 54 and the poly plug 18. The tantalum nitride layer 52 can comprise tantalum nitride constructed in accordance with either of the previously discussed embodiments. In other words, the tantalum nitride layer can comprise a single, homogeneous layer of tantalum nitride, with a preferred nitrogen atomic concentration of about 0.07 to 0.40, or it can comprise a bilayer. In the latter case, the bilayer preferably comprises a first sublayer having a nitrogen concentration of about 0.0 to 0.30, more preferably about 0.03 to 0.10, and a second sublayer with a nitrogen concentration of about 0.07 to 0.50, more preferably about 0.15 to 0.40. The disclosure with respect to the previous embodiments is therefore incorporated herein. Preferably, the bottom electrode 54 comprises an oxidation-resistant, highly conductive material, such as Ru or Pt.

Where the barrier layer 52 comprises a bilayer, it is preferred that the lower portion of the diffusion barrier layer 52 comprises a relatively thick, low N-content sublayer, which the upper portion of the barrier layer 52 comprises a relatively more thin, high N-content sublayer. In this way, the upper portion can comprise an effective barrier to oxidation diffusion, which the metal-rich lower portion comprises a metal source for silicidation with the underlying poly plug 18. Silicide formation between the poly plug 18 and the lower portion of the tantalum nitride bilayer thus serves to lower the contact resistance between the poly plug 18 and the bottom electrode 54.

While not illustrated, it will be understood that the structure of FIG. 7 is preferably completed as described for the previous embodiments, with an optional barrier layer between the bottom electrode and the capacitor dielectric, deposition and curing of a high k capacitor dielectric, and formation of a top electrode. The top electrode can be formed of tantalum nitride as well, in accordance with the previously described embodiments.

Although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

I claim:

1. An integrated circuit comprising:
   a capacitor dielectric comprising a high k material characterized by a dielectric constant of greater than about 20;
   a substrate underlying the capacitor dielectric; and
   an upper capacitor electrode including a barrier layer in a conductive flow path, the barrier layer formed of tantalum nitride having a nitrogen content between about 12% and 20%, the barrier layer overlying the capacitor dielectric, the barrier being configured to protect the capacitor dielectric by reducing the diffusion of oxygen from the capacitor dielectric.

2. The integrated circuit of claim 1, wherein the electrode serves as a reference electrode for the memory cell.

3. The integrated circuit of claim 1, wherein the high k material directly contacts the barrier layer.

4. The integrated circuit of claim 1, wherein the capacitor dielectric further comprises a layer of silicon nitride between the high k material and the substrate.

5. The integrated circuit of claim 1, wherein the high k material comprises a complex oxide.

6. The integrated circuit of claim 1, wherein the high k material comprises $Ta_2O_5$.

7. The integrated circuit of claim 1, further comprising a conductive strap directly contacting the electrode.

8. The integrated circuit of claim 1, wherein the electrode comprises at least two sublayers of tantalum nitride, each of the sublayers having a different concentration of nitrogen.

9. The integrated circuit of claim 1, wherein the electrode layer of tantalum nitride comprises a bilayer having two sublayers, each sublayer of the bilayer having a different concentration of nitrogen.

10. An integrated circuit comprising:
    a substrate;
    a capacitor dielectric formed from a high k material prone to charge leakage paths therethrough when the material is depleted of oxygen, the dielectric overlying the substrate; and
    a memory cell reference electrode including a barrier structure, the barrier structure directly overlying the dielectric, the barrier structure being formed of tantalum nitride having a nitrogen content between about 7% and 40%,
    wherein the barrier structure is configured to substantially prevent the depletion of oxygen from the dielectric by substantially preventing oxidation of the reference electrode.

11. The integrated circuit of claim 10, wherein the barrier structure comprises a first layer having a first nitrogen content and a second layer directly contacting the first layer, the second layer having a second nitrogen content greater than the first nitrogen content.

12. The integrated circuit of claim 11, wherein the first nitrogen content is between about 3% and 10%, and the second nitrogen content is between about 15% and 40%.

13. The integrated circuit of claim 12, wherein the first layer has a greater thickness than the second layer.

14. The integrated circuit of claim 13, wherein the first layer has a thickness in a range of about 120 Å to 1,000 Å and wherein the second layer has a thickness in a range of about 10 Å to 200 Å.

15. The integrated circuit of claim 14, wherein the first layer has a thickness in a range of about 150 Å to 450 Å and wherein the second layer has a thickness in a range of about 40 Å to 100 Å.

16. The integrated circuit of claim 11, wherein the second layer directly contacts a capacitor dielectric.

* * * * *

UNITED STATES PATENT AND TRADEMARK OFFICE
CERTIFICATE OF CORRECTION

PATENT NO.   : 6,580,115 B2
DATED        : June 17, 2003
INVENTOR(S)  : Agarwal

It is certified that error appears in the above-identified patent and that said Letters Patent is hereby corrected as shown below:

Drawings,
Replace FIGS. 2-5 with the attached FIGS. 2-5.

Signed and Sealed this

Twenty-first Day of September, 2004

JON W. DUDAS
*Director of the United States Patent and Trademark Office*